(12) United States Patent
Namiki et al.

(10) Patent No.: US 9,340,710 B2
(45) Date of Patent: *May 17, 2016

(54) LIGHT-REFLECTIVE CONDUCTIVE PARTICLE, ANISOTROPIC CONDUCTIVE ADHESIVE AND LIGHT-EMITTING DEVICE

(71) Applicant: DEXERIALS CORPORATION, Tokyo (JP)

(72) Inventors: Hidetsugu Namiki, Tochigi (JP); Shiyuki Kanisawa, Tochigi (JP); Hideaki Umakoshi, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 46 days.

This patent is subject to a terminal disclaimer.

(21) Appl. No.: 14/134,578

(22) Filed: Dec. 19, 2013

(65) Prior Publication Data

US 2014/0103266 A1  Apr. 17, 2014

Related U.S. Application Data

(62) Division of application No. 13/496,405, filed as application No. PCT/JP2010/062307 on Jul. 22, 2010, now Pat. No. 8,796,725.

(30) Foreign Application Priority Data

Oct. 16, 2009  (JP) .................................. 2009-239578

(51) Int. Cl.
*H01L 33/46* (2010.01)
*H01L 33/62* (2010.01)
(Continued)

(52) U.S. Cl.
CPC . *C09J 9/02* (2013.01); *C08G 59/42* (2013.01); *C08L 23/02* (2013.01); *C08L 63/00* (2013.01); *C09J 11/04* (2013.01); *C09J 123/02* (2013.01);
(Continued)

(58) Field of Classification Search
CPC ............. C09J 9/02; H01L 33/46; H01L 33/62
See application file for complete search history.

(56) References Cited

U.S. PATENT DOCUMENTS 8,262,940 B2  9/2012  Abe
2007/0126356 A1  6/2007  Tanda et al.

FOREIGN PATENT DOCUMENTS

CN  1809768 A  7/2006
CN  1976079 A  6/2007
(Continued)

OTHER PUBLICATIONS

Nov. 4, 2013 Office Action issued in Taiwan Patent Application No. 99126886 (with translation).
(Continued)

*Primary Examiner* — Matthew W Such
*Assistant Examiner* — Scott Stowe
(74) *Attorney, Agent, or Firm* — Oliff PLC (57) ABSTRACT

A light-reflective conductive particle for an anisotropic conductive adhesive used for anisotropic conductive connection of a light-emitting element to a wiring board includes a core particle coated with a metal material and a light-reflecting layer formed from light-reflective inorganic particles having a refractive index of 1.52 or more on a surface of the core particle. Examples of the light-reflective inorganic particles having a refractive index of 1.52 or more include titanium oxide particles, zinc oxide particles, or aluminum oxide particles.

6 Claims, 3 Drawing Sheets

(51) Int. Cl.
  *C09J 9/02*    (2006.01)
  *C08L 23/02*   (2006.01)
  *C09J 11/04*   (2006.01)
  *C09J 123/02*  (2006.01)
  *H01L 33/60*   (2010.01)
  *C08G 59/42*   (2006.01)
  *C08L 63/00*   (2006.01)
  *C08K 3/08*    (2006.01)
  *C08K 9/02*    (2006.01)
  *H01L 23/00*   (2006.01)

(52) U.S. Cl.
  CPC ............. *H01L 24/29* (2013.01); *H01L 33/60* (2013.01); *C08K 3/08* (2013.01); *C08K 9/02* (2013.01); *H01L 24/16* (2013.01); *H01L 24/32* (2013.01); *H01L 24/45* (2013.01); *H01L 24/73* (2013.01); *H01L 24/83* (2013.01); *H01L 2224/13144* (2013.01); *H01L 2224/16225* (2013.01); *H01L 2224/16227* (2013.01); *H01L 2224/2929* (2013.01); *H01L 2224/2939* (2013.01); *H01L 2224/2949* (2013.01); *H01L 2224/29344* (2013.01); *H01L 2224/29347* (2013.01); *H01L 2224/29355* (2013.01); *H01L 2224/29386* (2013.01); *H01L 2224/29444* (2013.01); *H01L 2224/29447* (2013.01); *H01L 2224/29455* (2013.01); *H01L 2224/29499* (2013.01); *H01L 2224/29644* (2013.01); *H01L 2224/29647* (2013.01); *H01L 2224/29655* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/73204* (2013.01); *H01L 2224/73265* (2013.01); *H01L 2224/83851* (2013.01); *H01L 2924/00013* (2013.01); *H01L 2924/01004* (2013.01); *H01L 2924/01012* (2013.01); *H01L 2924/01015* (2013.01); *H01L 2924/01019* (2013.01); *H01L 2924/01029* (2013.01); *H01L 2924/01046* (2013.01); *H01L 2924/01047* (2013.01); *H01L 2924/01057* (2013.01); *H01L 2924/01078* (2013.01); *H01L 2924/01079* (2013.01); *H01L 2924/07811* (2013.01); *H01L 2924/12041* (2013.01); *H01L 2924/181* (2013.01)

(56) References Cited

FOREIGN PATENT DOCUMENTS

| | | |
|---|---|---|
| CN | 1993635 A | 7/2007 |
| CN | 101084458 A | 12/2007 |
| CN | 101241207 A | 8/2008 |
| CN | 101467077 A | 6/2009 |
| JP | A-4-259766 | 9/1992 |
| JP | A-11-20233 | 1/1999 |
| JP | A-11-168235 | 6/1999 |
| JP | A-2001-7391 | 1/2001 |
| JP | 2001-240901 A | 9/2001 |
| JP | A-2003-249689 | 9/2003 |
| JP | A-2004-179139 | 6/2004 |
| JP | A-2004-266134 | 9/2004 |
| JP | A-2005-064233 | 3/2005 |
| JP | A-2007-123613 | 5/2007 |
| JP | A-2007-157940 | 6/2007 |
| JP | A-2008-4751 | 1/2008 |
| TW | 2009-33649 | 8/2009 |
| WO | 03/025955 A1 | 3/2003 |
| WO | 2009/054386 A1 | 4/2009 |
| WO | WO 2009/069671 A1 | 6/2009 |
| WO | WO 2009/104653 A1 | 8/2009 |

OTHER PUBLICATIONS

Feb. 15, 2015 Office Action issued in Chinese Application No. 201080047702.5.
Jul. 8, 2014 Notification of Reasons for Refusal issued in Japanese Patent Application No. 2013-179777 (with English translation).
Aug. 28, 2014 Extended European Search Report issued in Application No. 10823230.7.
Nov. 11, 2014 Decision of Refusal issued in Japanese Patent Application No. 2013-179777 (with English translation).
Sep. 19, 2013 Office Action issued in U.S. Appl. No. 13/496,405.
International Preliminary Report on Patentability issued in International Patent Application No. PCT/JP2010/062307 dated Aug. 30, 2011 (with translation).
Japanese Office Action issued in Japanese Patent Application No. 2009-239578 on Jul. 2, 2013 (with translation).
Office Action issued in Japanese Patent Application No. 2009-239578 mailed Apr. 10, 2013 (with translation).
International Search Report issued in International Patent Application No. PCT/JP2010/062307 dated Aug. 31, 2010.
Jul. 8, 2015 Third Office Action issued in Chinese Patent Application No. 201080047702.5.
Jul. 23, 2015 Office Action issued in Taiwanese Patent Application No. 103126553.

LIGHT-REFLECTIVE CONDUCTIVE PARTICLE, ANISOTROPIC CONDUCTIVE ADHESIVE AND LIGHT-EMITTING DEVICE

TECHNICAL FIELD

This application is a Divisional of U.S. application Ser. No. 13/496,405, filed Mar. 15, 2012, which is a national stage entry of Patent Cooperation Treaty International Application No. 2010-062307, filed Jul. 22, 2010, and claims priority to Japanese Patent Application No. 2009-239578, filed on Oct. 16, 2009. The prior applications, including the specifications, drawings and abstracts are incorporated herein by reference in their entirety.

BACKGROUND ART

Figure 4:
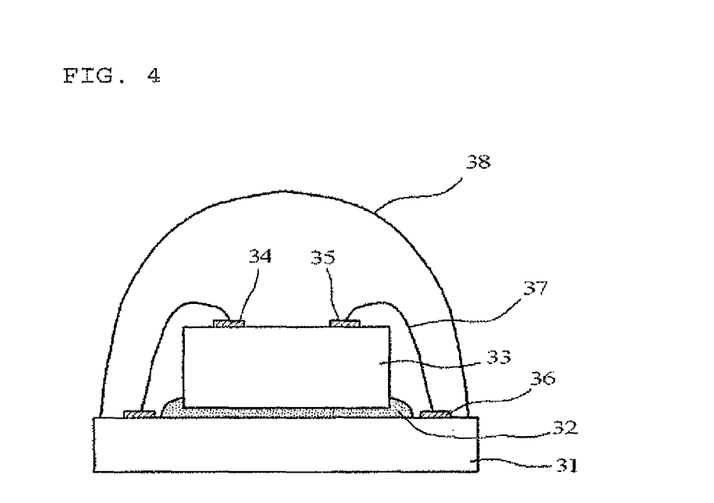
FIG. 4 is a cross-sectional view of a conventional light-emitting device.

Light-emitting devices that use a light-emitting diode (LED) element are widely used. Older-type light-emitting devices are configured by, as illustrated in FIG. 4, joining an LED element 33 to a substrate 31 with a die bond adhesive 32, wire-bonding a p electrode 34 and an n electrode 35 on an upper face of the LED element 33 to a connection terminal 36 on the substrate 31 with a gold wire 37, and then sealing the whole of the LED element 33 with a transparent mold resin 38. However, for the light-emitting device illustrated in FIG. 4, there is the problem that, among the light emitted by the LED element 33, the light having a wavelength of 400 to 500 nm that is output to the upper face side is absorbed by the gold wire, and a part of the light output to the lower face side is absorbed by the die bond adhesive 32, whereby the light-emitting efficiency of the LED element 33 deteriorates.

Figure 5:
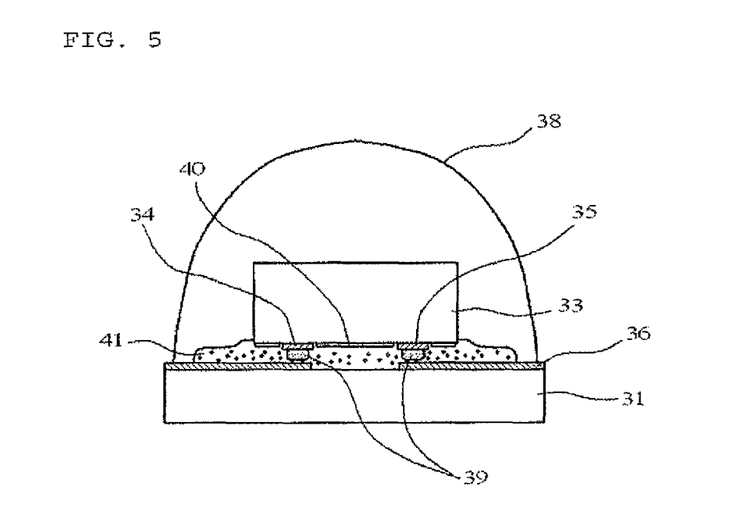
FIG. 5 is a cross-sectional view of a conventional light-emitting device.

Consequently, as illustrated in FIG. 5, flip chip mounting of the LED element 33 has been proposed (Patent Literature 1). In this flip chip mounting technique, a bump 39 is formed on both the p electrode 34 and the n electrode 35. Furthermore, a light-reflecting layer 40 is provided on the surface of the LED element 33 on which the bumps are formed so that the p electrode 34 and the n electrode 35 are insulated. The LED element 33 and the substrate 31 are fixedly connected using an anisotropic conductive paste 41 or an anisotropic conductive film (not illustrated), and curing the paste or film. Consequently, in the light-emitting device illustrated in FIG. 5, the light output toward the upper side of the LED element 33 is not absorbed by the gold wire, and most of the light output toward the lower side is reflected by the light-reflecting layer 40 and is output upwards. As a result, the light-emitting efficiency (light extraction efficiency) does not deteriorate.

CITATION LIST

Patent Literature

[Patent Document 1] Japanese Patent Application Laid-Open No. Hei. 11-168235

SUMMARY OF INVENTION

Problems to be Solved by the Invention

However, with the technique described in Patent Document 1, the light-reflecting layer 40 has to be provided on the LED element 33 by a method such as metal vapor deposition so that the p electrode 34 and the n electrode 35 are insulated. Therefore, from a production perspective, there is the problem that an increase in costs cannot be avoided.

On the other hand, if the light-reflecting layer 40 is not provided, the surface of the conductive particles coated with gold, nickel, or copper in the cured anisotropic conductive paste or anisotropic conductive film exhibit a color that is from brown to dark brown. Further, the epoxy resin binder in which the conductive particles are dispersed itself also exhibits a brown color due to the imidazole latent curing agent that is normally used for curing. Consequently, there are the problems that it is difficult to improve the light-emitting efficiency (light extraction efficiency) of the light emitted by the light-emitting element, and that the color of the emitted light (emission color) could not be reflected as that color without change.

It is an object of the present invention to resolve the above-described problems in the conventional art, and to provide a light-reflective conductive particle that does not reduce light-emitting efficiency and does not produce a hue difference between the emission color of the light-emitting element and the reflected color even if a light-reflecting layer that causes production costs to increase is not provided on a light-emitting diode (LED) element, when producing a light-emitting device by flip-chip mounting a light-emitting element such as an LED element on a wiring board using an anisotropic conductive adhesive. Further, it is an object of the present invention is to provide an anisotropic conductive adhesive containing the light-reflective conductive particle, as well as a light-emitting device formed by using this adhesive to mount a light-emitting element to a wiring board.

Means for Solving the Problems

Based on the hypothesis that deterioration in light-emitting efficiency can be prevented if an anisotropic conductive adhesive itself is made to have a light-reflecting function, the present inventor has found that deterioration in the light-emitting efficiency of a light-emitting element and the occurrence of a hue difference between the emission color of the light-emitting element and the color reflected from the conductive particles can be prevented by providing a light-reflecting layer having a white to grey color formed from specific inorganic particles on the surface of conductive particles that are blended in an anisotropic conductive adhesive, thereby completing the present invention.

Specifically, the present invention provides a light-reflective conductive particle for an anisotropic conductive adhesive used for anisotropic conductive connection of a light-emitting element to a wiring board, comprising a core particle coated with a metal material and a light-reflecting layer formed from light-reflective inorganic particles having a refractive index of 1.52 or more on a surface of the core particle.

Further, the present invention provides an anisotropic conductive adhesive used for anisotropic conductive connection of a light-emitting element to a wiring board, the adhesive comprising the above-described light-reflective conductive particle dispersed in a thermosetting resin composition that forms a cured product having a light transmittance (JIS K7105) of 80% or more at a light path length of 1 cm to visible light having a wavelength of 380 to 780 nm.

In addition, the present invention provides a light-emitting device formed by mounting a light-emitting element by a flip-chip mounting method to a wiring board with the above-described light-reflective anisotropic conductive adhesive provided therebetween.

Advantageous Effects of the Invention

The light-reflective conductive particle of the present invention for an anisotropic conductive adhesive used for anisotropic conductive connection of a light-emitting element to a wiring board is formed from a core particle coated with a metal material and a light-reflecting layer which has a white to grey color and is formed from light-reflective inorganic particles having a refractive index of 1.52 or more on a surface of the core particle. Further, the anisotropic conductive adhesive of the present invention comprises this light-reflective conductive particle dispersed in a thermosetting resin composition that forms a cured product having a light transmittance (JIS K7105) of 80% or more at a light path length of 1 cm to visible light having a wavelength of 380 to 780 nm. Therefore, a light-emitting device obtained using the anisotropic conductive adhesive of the present invention does not discolor even if the anisotropic conductive adhesive is cured. Moreover, since the included light-reflective conductive particles have a low dependence of the reflecting property to the wavelength of the visible light, light-emitting efficiency can be improved, and the emission color of the light-emitting element can be reflected as that color without change.

DESCRIPTION OF EMBODIMENTS

The present invention will now be described in more detail with reference to the drawings.

Figure 1A:
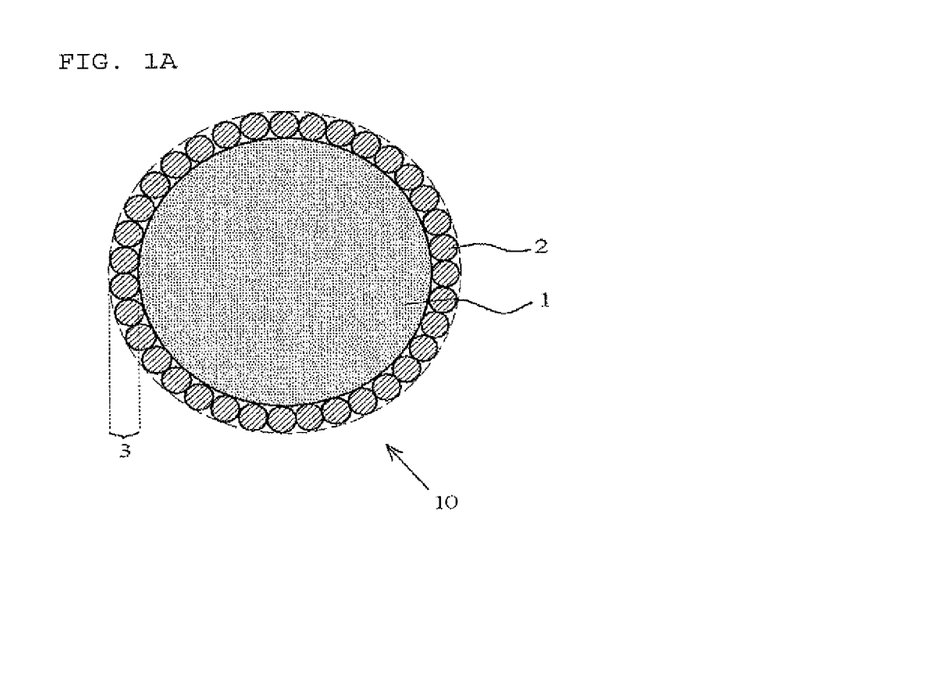
FIG. 1A is a cross-sectional view of a light-reflective conductive particle of the present invention for an anisotropic conductive adhesive.
Figure 1B:
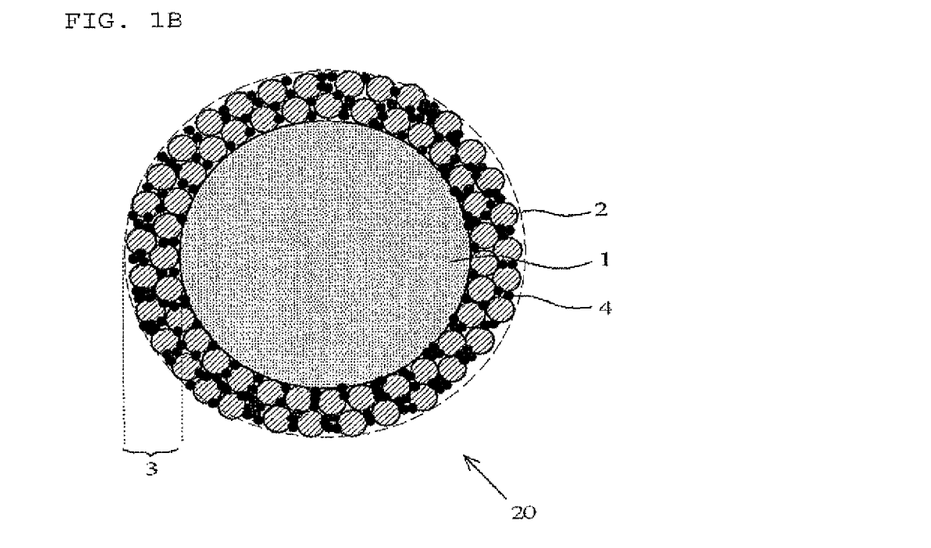
FIG. 1B is a cross-sectional view of a light-reflective conductive particle of the present invention for an anisotropic conductive adhesive.

FIGS. 1A and 1B are cross-sectional views of light-reflective conductive particles 10 and 20 of the present invention for an anisotropic conductive adhesive. First, the light-reflective conductive particles of FIG. 1A will be described.

The light-reflective conductive particle 10 is formed from a core particle 1 coated with a metal material and a light-reflecting layer 3 formed from light-reflective inorganic particles 2 having a refractive index of 1.52 or more that are on the surface of the core particle 1.

The light-reflective inorganic particles 2 having a refractive index of 1.52 or more are inorganic particles that look white under sunlight. Therefore, the light-reflecting layer 3 formed from these particles exhibits a color from white to grey. The fact that this layer exhibits a color from white to grey means that the dependence of the reflecting property to the wavelength of the visible light is small, and that visible light is easily reflected.

Examples of the preferred light-reflective inorganic particles 2 include at least one kind selected from titanium oxide ($TiO_2$) particles, zinc oxide (ZnO) particles, and aluminum oxide ($Al_2O_3$) particles. Among the titanium oxide particles, zinc oxide particles, or aluminum oxide particles, if there are concerns about light degradation of the cured product of the thermosetting resin in the cured anisotropic conductive adhesive, zinc oxide, which does not exhibit a catalytic activity to light degradation and has the highest refractive index, can be preferably used.

Since the core particle 1 is used for anisotropic conductive connection, the surface of the core particle 1 is formed from a metal material. Modes in which the surface is coated with a metal material include a mode in which the core particle 1 itself is a metal material, and a mode in which the surface of a resin particle is coated with a metal material.

As the metal material, metal materials that are conventionally used as conductive particles for anisotropic conductive connection can be used. Examples thereof include gold, nickel, copper, silver, solder, palladium, aluminum, alloys thereof, multilayer composites thereof (e.g., a nickel plating/gold flash plating composite) and the like. Among these, gold, nickel, and copper can exhibit the advantages effects of the present invention more than other metal materials, as they make the conductive particles brown.

If the core particle 1 is formed by coating a metal material on a resin particle, the resin particle portion of a conventionally-used metal-coated resin particle can be employed as the conductive particle for anisotropic conductive connection. Examples of such resin particles include styrene resin particles, benzoguanamine resin particles, nylon resin particles and the like. A conventionally-known method may be employed for coating the resin particles with a metal material. For example, an electroless plating method or an electroplating method may be utilized. Further, the thickness of the coated metal material is a thickness that is sufficient to ensure a good connection reliability. Although this depends on the particle size of the resin particles and the type of metal, usually, the thickness is 0.1 to 3 μm, and preferably 0.1 to 1 μm.

Further, if the particle size of the core particle 1 having a metal material surface is too small, electrical continuity failures tend to occur, while if the particle size is too large, short circuits between patterns tend to occur. Therefore, the particle size is preferably 1 to 20 μm, more preferably 3 to 5 μm, and especially preferably 3 to 5 μm. In this case, it is preferred that the shape of the core particle 1 be spherical, although the shape may also be flake-like or a rugby ball shape.

When viewed from the perspective of relative size to the particle size of the core particle 1, if the thickness of the light-reflecting layer 3 formed from the light-reflective inorganic particles 2 is too small with respect to the core particle 1 particle size, reflectance tends to deteriorates, while if this thickness is too large, electrical continuity failures tend to occur. Therefore, the thickness is preferably 0.5 to 50%, and more preferably 1 to 25% of the particle size of the core particle 1.

Further, in the light-reflective conductive particle 10, if the particle size of the light-reflective inorganic particles 2 forming the light-reflecting layer 3 is too small, it tends to be difficult to produce a light-reflecting phenomenon, while if this particle size is too large, it tends to be difficult to form the light-reflecting layer. Therefore, the particle size is preferably 0.02 to 4 μm, more preferably 0.1 to 1 μm, and especially preferably 0.2 to 0.5 μm. In this case, from the perspective of the wavelength of the light that is reflected, it is preferred that the particle size of the light-reflective inorganic particles 2 be 50% or more of the wavelength of that light so that the light that should be reflected (i.e., the light emitted by the light-emitting element) does not pass through. In this case, examples of the shape of the light-reflective inorganic particles 2 include amorphous, spherical, scale-like, needle-like and the like. However, among these, from the perspective of a light diffusion effect, spherical is preferred, and from a total reflection effect, a scale-like shape is preferred.

The light-reflective conductive particle 10 illustrated in FIG. 1A can be produced by a known deposition technology (so-called mechanofusion) in which a film formed from small particles on the surface of large particles is formed by making the small and large powders physically collide. In this case, the light-reflective inorganic particles 2 are fixed so as to bite the metal material on the surface of the core particles 1. On the other hand, it is difficult to make inorganic particles fuse and fix together. Accordingly, a monolayer of inorganic particles forms the light-reflecting layer 3. Therefore, in the case of FIG. 1A, the thickness of the light-reflecting layer 3 can be considered to be the same to slightly thinner than the particle size of the light-reflective inorganic particles 2.

Next, the light-reflective conductive particle 20 illustrated in FIG. 1B will be described. The light-reflective conductive particle 20 differs from the light-reflective conductive particle 10 of FIG. 1A in including a thermoplastic resin 4 in which the light-reflecting layer 3 functions as an adhesive, and in that the light-reflective inorganic particles 2 themselves are also fixed by this thermoplastic resin 4 so that the light-reflective inorganic particles 2 form a multilayer structure (for example, a two- or three-layer multilayer structure). By including such a thermoplastic resin 4, the mechanical strength of the light-reflecting layer 3 improves, and it is more difficult for the inorganic particles to fall off and the like.

The light-reflective conductive particle 20 illustrated in FIG. 1B can also be produced by mechanofusion. In this case, in addition to the light-reflective inorganic particles 2 and the core particle 1, a particulate thermoplastic resin 4 can also be used. When producing the light-reflective conductive particle 20 illustrated in FIG. 12 by mechanofusion, the light-reflective conductive particle 10 illustrated in FIG. 1A is also produced at the same time.

In consideration of reducing the burden on the environment, it is preferred to use a halogen-free thermoplastic resin as the thermoplastic resin 4. For example, it is preferred to use a polyolefin such as polyethylene and polypropylene, a polystyrene, an acrylic resin and the like.

Such a light-reflective conductive particle 20 can also be produced by mechanofusion. If the particle size of the thermoplastic resin 4 employed in mechanofusion is too small, its effect as an adhesive is reduced, while if this particle size is too large, it is more difficult for the resin to adhere to the core particle 1. Therefore, the particle size is preferably 0.02 to 4 μm, and more preferably 0.1 to 1 μm. Further, if the blended amount of such a thermoplastic resin 4 is too low, its effect as an adhesive is reduced, while if this blended amount is too much, unintended particle agglomerates form. Therefore, the blended amount is preferably, based on 100 parts by mass of the core particle 1, 0.2 to 500 parts by mass, and more preferably 4 to 25 parts by mass.

Next, the anisotropic conductive adhesive of the present invention will be described. This anisotropic conductive adhesive includes the light-reflective conductive particle of the present invention dispersed in a thermosetting resin composition, and may be in the form of a paste, film or the like.

It is preferred to use a composition that is as colorless and transparent as possible for the thermosetting resin composition used in the anisotropic conductive adhesive of the present invention. This is to prevent deterioration in the light reflection efficiency of the light-reflective conductive particles in the anisotropic conductive adhesive, and to reflect the incident light without changing its color. Here, "colorless and transparent" means a light transmittance (JIS K7105) of 80% or more, and preferably 90% or more, at a light path length of 1 cm to visible light having a wavelength of 380 to 780 nm.

In the anisotropic conductive adhesive of the present invention, if the blended amount of the light-reflective conductive particles based on 100 parts by mass of the thermosetting resin composition is too low, electrical continuity failures tend to occur, while if the blended amount is too much, short circuits between patterns tend to occur. Therefore, the blended amount is preferably 1 to 100 parts by mass, and more preferably 10 to 50 parts by mass.

Concerning the reflection properties of the anisotropic conductive adhesive of the present invention, to improve the light-emitting efficiency of the light-emitting element, it is preferred that the reflectance (JIS K7105) of a 100 μm-thick cured product of the anisotropic conductive adhesive to light with a wavelength of 450 nm be at least 15%. To obtain such a reflectance, the reflection properties and blended amount of the used light-reflective conductive particles, and the blended composition of the thermosetting resin composition may be appropriately adjusted. Generally, if the blended amount of light-reflective conductive particles having good reflection properties is increased, the reflectance also tends to increase.

The reflection properties of the anisotropic conductive adhesive can also be evaluated from the perspective of refractive index (JIS K7142). Specifically, this is because if the difference in the refractive index of the thermosetting resin composition of the anisotropic conductive adhesive and that of the light-reflective conductive particles is too large, the light reflection amount at the interface between the light-reflective conductive particles and the cured product of the thermosetting resin composition encircling those particles increases. More specifically, it is preferred that the difference in the refractive index between the thermosetting resin composition and the light-reflective inorganic particles be 0.02 or more, and preferably 0.3 or more. Generally, the refractive index of the thermosetting resin composition that mainly contains the epoxy resin is approximately 1.5.

As the thermosetting resin composition constituting the anisotropic conductive adhesive of the present invention, a resin composition that is used in conventional anisotropic conductive adhesives and anisotropic conductive films can be used. Generally, such a thermosetting resin composition blends a curing agent in an insulating binder resin. Preferred examples of the insulating binder resin include epoxy resins having an alicyclic epoxy resin, a heterocyclic epoxy resin, a hydrogenated epoxy resin or the like as a main component.

It is preferred that the alicyclic epoxy compound have two or more epoxy groups in the molecule. The alicyclic epoxy compound may be a liquid or a solid. Specific examples include glycidyl hexahydrobisphenol A, 3,4-epoxycyclohexenylmethyl-3',4'-epoxycyclohexene carboxylate and the like. Among these, from the perspectives of ensuring that the cured product has an optical transparency suitable for mounting an LED element and the like, and excellent fast-curing properties, it is preferred to use glycidyl hexahydrobisphenol A or 3,4-epoxycyclohexenylmethyl-3',4'-epoxycyclohexene carboxylate.

Examples of heterocyclic epoxy compounds include epoxy compounds having a triazine ring. Especially preferred is 1,3,5-tris(2,3-epoxypropyl)-1,3,5-triazine-2,4,6-(1H,3H,5H)-trione.

As the hydrogenated epoxy compound, hydrogenated products of the above-described alicyclic epoxy compounds and heterocyclic epoxy compounds, and other well-known hydrogenated epoxy resins can be used.

The alicyclic epoxy compound, heterocyclic epoxy compound, and hydrogenated epoxy compound may be used alone, or two or more kinds may be used together. In addition to these epoxy compounds, other epoxy compounds can also be used, as long as the effects of the present invention are not harmed. Examples thereof include known epoxy resins such as: glycidyl ethers obtained by reacting epichlorohydrin with a polyhydric phenol such as bisphenol A, bisphenol F, bisphenol S, tetramethylbisphenol A, diallylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol. F, tris(hydroxyphenyl)methane, bixylenol, phenol-novolac, or cresol-novolac; polyglycidyl ethers obtained by reacting epichlorohydrin with an aliphatic polyhydric alcohol such as glycerin, neopentyl glycol, ethylene glycol, propylene glycol, butylene glycol, hexylene glycol, polyethylene glycol, or polypropylene glycol; glycidyl ether esters obtained by reacting epichlorohydrin with a hydroxycarboxylic acid such as p-oxybenzoic acid or β-oxynaphthoic acid; polyglycidyl esters obtained from polycarboxylic acids such as phthalic acid, methylphthalic acid, isophthalic acid, terephthalic acid, tetrahydrophthalic acid, endomethylene tetrahydrophthalic acid, endomethylene hexahydrophthalic acid, trimellitic acid, and polymerized fatty acids; glycidylaminoglycidyl ethers obtained from aminophenols and aminoalkylphenols; glycidylaminoglycidyl esters obtained from aminobenzoic acids; glycidylamines obtained from aniline, toluidine, tribromoaniline, xylylenediamine, diamino cyclohexane, bisaminomethylcyclohexane, 4,4'-diaminodiphenyl methane, and 4,4'-diaminodiphenyl sulfone; and epoxydized polyolefins.

Examples of curing agents that can be used include acid anhydrides, imidazole compounds, cyanogens and the like. Among these, it is preferred to use acid anhydrides that tend not to change the color of the cured product, especially an alicyclic acid anhydride curing agent. A specific preferred example that can be used is methyl hexahydrophthalic anhydride (MeHHPA).

When using an alicyclic epoxy compound and an alicyclic acid anhydride curing agent in the thermosetting resin composition of the anisotropic conductive adhesive of the present invention, if the used amount of the alicyclic acid anhydride curing agent is too low, the curing defects tend to occur due to an increased amount of uncured epoxy compound, while if the used amount is too much, corrosion of the coated material tends to be promoted due to the influence of excess curing agent. Therefore, it is preferred to use the alicyclic acid anhydride curing agent in a ratio of, based on 100 parts by mass of alicyclic epoxy compound, 80 to 120 parts by mass, and more preferably 95 to 105 parts by mass.

The anisotropic conductive adhesive of the present invention can be produced by uniformly mixing the light-reflective conductive particles and the thermosetting resin composition. Further, if using the anisotropic conductive adhesive as an anisotropic conductive film, this film can be obtained by dispersing and mixing the above materials in a solvent such as toluene, coating the resultant mixture to a desired thickness on a release-treated PET film, and then drying at a temperature of about 80° C.

Figure 2:
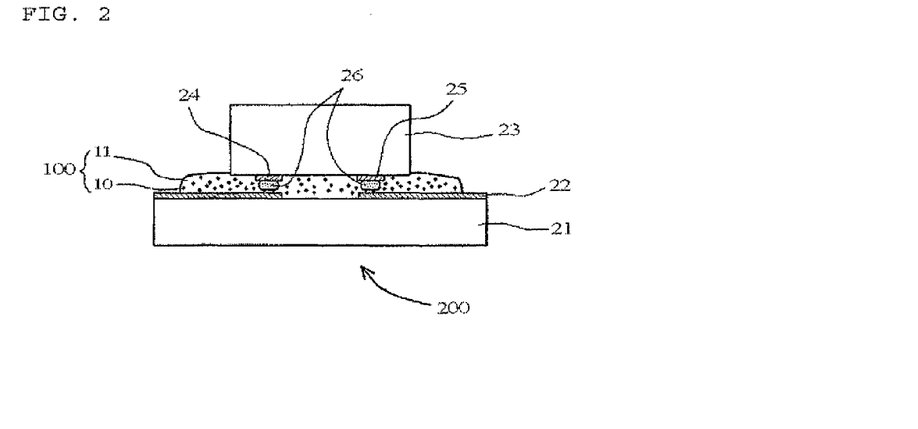
FIG. 2 is a cross-sectional view of a light-emitting device of the present invention.

Next, the light-emitting device of the present invention will be described with reference to FIG. 2. A light-emitting device 200 is a light-emitting device in which a substrate 21 and an LED element 23 are flip-chip mounted, formed by coating the above-described anisotropic conductive adhesive of the present invention between a connection terminal 22 on the substrate 21 and connection bumps 26 respectively formed on an n electrode 24 and a p electrode 25 of the LED element 23 as a light-emitting element. Here, the cured product 100 of the anisotropic conductive adhesive is formed with light-reflective conductive particles 10 dispersed in a cured product 11 of the thermosetting resin composition. Optionally, a transparent mold resin may be applied so as to seal the whole of the LED element 23.

In the thus-configured light-emitting device 200, of the light emitted by the LED element 23, the light emitted toward the substrate 21 side is reflected by the light-reflective conductive particles 10 in the cured product 100 of the anisotropic conductive adhesive, and is output from the upper face of the LED element 23. Therefore, a deterioration in the light-emitting efficiency can be prevented.

EXAMPLES

Example 1

Production of Light-Reflective Conductive Particles

The light-reflective conductive particles of Example 1 were obtained by adding 4 parts by mass of a titanium oxide powder having an average particle size of 0.5 μm (KR-380, Titan Kogyo, Ltd.) and 20 parts by mass of Au-coated resin conductive particles having a brown appearance and an average particle size of 5 μm (particles formed by coating a 0.2 μm-thick electroless gold plating on spherical acrylic resin particles having an average particle size of 4.6 μm (Bright 20GNB4.6 EH, Nippon Chemical Industrial Co., Ltd.)) to a mechanofusion apparatus (AMS-GMP, Hosokawa Micron Corporation), and depositing an approximately 0.3 μm-thick light-reflecting layer formed from the titanium oxide particles on the surface of the conductive particles under conditions of a rotation speed of 1,000 rpm and a rotation time of 20 minutes. The appearance of these light-reflective conductive particles was grey.

(Light Reflectance Evaluation Test)

15 parts by mass of the obtained light-reflective conductive particles and 100 parts by mass of a colorless, transparent thermosetting epoxy binder composition having a refractive index of approximately 1.5 (YX-8000, Mitsubishi Chemical Corporation) were uniformly mixed using a vacuum defoaming stirring apparatus to obtain the anisotropic conductive adhesive of Example 1.

The obtained anisotropic conductive adhesive was coated on a white ceramic plate to a dry thickness of 100 μm, and heated for 1 minute at 200° C. to cure. The reflectance of this cured product to light with a wavelength of 450 nm (JIS K7105) was measured using a spectrophotometer (U3300, Hitachi, Ltd.). The obtained results are shown in Table 1 and in FIG. 3.

(Electrical Properties (Continuity Reliability, Insulation Reliability) Evaluation Test)

Using the anisotropic conductive adhesive prepared during the light reflectance evaluation test, a 6 mm-square test IC chip (conductor connection surface area/conductor–space=1, 600 μm$^2$/50 μmP) having 15 μm-high gold bumps was flip-chip mounted on a glass epoxy substrate having wires formed by plating Ni/Au (5.0 μm thick/0.3 μm thick) on a copper wire at a 50 μm pitch under conditions of 200° C., 60 seconds, and 1 Kg/chip to obtain a test IC module.

1. Continuity Reliability

The obtained test IC module was subjected to a temperature cycle test (TCT) (JIS C5030) of alternately heating and cooling to a hot temperature (100° C.) and a cold temperature (−40° C.), and the initial resistance and the resistance after 500 cycles were measured by a four-terminal method. Cases in which resistance was less than 1Ω were evaluated with rank A, and cases in which resistance was 1Ω or more were evaluated with rank C. The obtained results are shown in Table 1.

2. Insulation Reliability

A separately-produced test IC module was subjected to an aging test of leaving for 1,000 hours under an 85° C., 85% RH environment, and the initial resistance and the resistance after 1,000 hours were measured. Cases in which resistance was $10^6$ Ω or more were evaluated with rank A, and cases in which resistance was less than $10^6$ Ω were evaluated with rank C. The obtained results are shown in Table 1.

Example 2

Light-reflective conductive particles having a grey appearance, and an anisotropic conductive adhesive, were obtained in the same manner as in Example 1, except that Ni-coated resin conductive particles having an average particle size of 5.0 μm (52NR-4.6 EH, Nippon Chemical Industrial Co., Ltd.) were used instead of Au-coated resin conductive particles. Further, a light reflectance evaluation test and an electrical properties (continuity reliability, insulation reliability) evaluation test were also carried out in the same manner as in Example 1. The obtained results are shown in Table 1.

Example 3

Light-reflective conductive particles having a grey appearance were obtained by adding 4 parts by mass of a titanium oxide powder having an average particle size of 0.5 μm (KR-380, Titan Kogyo, Ltd.), 3 parts by mass of polystyrene (PS) particles having an average particle size of 0.2 μm (Glossdell 204S, Mitsui Chemicals, Inc.) as adhesive particles, and 20 parts by mass of conductive particles having an average particle size of 5 μm (particles formed by coating a 0.2 μm-thick electroless gold plating on spherical acrylic resin particles having an average particle size of 4.6 μm (Bright 20GNB4.6 EH, Nippon Chemical Industrial Co., Ltd.) to a mechanofusion apparatus (AMS-GMP, Hosokawa Micron Group), and depositing an approximately 1 μm-thick light-reflecting layer formed from styrene and titanium oxide particles on the surface of the conductive particles under conditions of a rotation speed of 1,000 rpm and a rotation time of 20 minutes. Then, an anisotropic conductive adhesive was obtained. Further, a light reflectance evaluation test and an electrical properties (continuity reliability, insulation reliability) evaluation test were also carried out in the same manner as in Example 1. The obtained results are shown in Table 1.

Example 4

Light-reflective conductive particles having a grey appearance, and an anisotropic conductive adhesive, were obtained in the same manner as in Example 3, except that Ni-coated resin conductive particles having an average particle size of 5.0 μm (52NR-4.6 EH, Nippon Chemical Industrial Co., Ltd.) were used instead of Au-coated resin conductive particles. Further, a light reflectance evaluation test and an electrical properties (continuity reliability, insulation reliability) evaluation test were also carried out in the same manner as in Example 1. The obtained results are shown in Table 1.

Example 5

Light-reflective conductive particles having a grey appearance, and an anisotropic conductive adhesive, were obtained in the same manner as in Example 3, except that polyethylene (PE) particles having an average particle size of 0.2 μm (Amiparl WF300, Mitsui Chemicals, Inc.) were used instead of the polystyrene particles having an average particle size of 0.2 μm (Glossdell 204S, Mitsui Chemicals, Inc.). Further, a light reflectance evaluation test and an electrical properties (continuity reliability, insulation reliability) evaluation test were also carried out in the same manner as in Example 1. The obtained results are shown in Table 1.

Example 6

Light-reflective conductive particles having a grey appearance, and an anisotropic conductive adhesive, were obtained in the same manner as in Example 3, except that a zinc oxide powder having an average particle size of 0.5 μm (one kind of zinc oxide, Hakusuitech, Ltd.) was used instead of the titanium oxide powder having an average particle size of 0.5 μm. Further, a light reflectance evaluation test and an electrical properties (continuity reliability, insulation reliability) evaluation test were also carried out in the same manner as in Example 1. The obtained results are shown in Table 1.

Example 7

Light-reflective conductive particles having a grey appearance, and an anisotropic conductive adhesive, were obtained in the same manner as in Example 3, except that an aluminum oxide powder having an average particle size of 0.5 μm (AE-2500SI, Admatechs, Co., Ltd.) was used instead of the titanium oxide powder having an average particle size of 0.5 μm. Further, a light reflectance evaluation test and an electrical properties (continuity reliability, insulation reliability) evaluation test were also carried out in the same manner as in Example 1. The obtained results are shown in Table 1.

Example 8

Light-reflective conductive particles having a grey appearance, and an anisotropic conductive adhesive, were obtained in the same manner as in Example 3, except that magnesium carbonate having an average particle size of 0.5 μm was used instead of the titanium oxide powder having an average particle size of 0.5 μm. Further, a light reflectance evaluation test and an electrical properties (continuity reliability, insulation reliability) evaluation test were also carried out in the same manner as in Example 1. The obtained results are shown in Table 1.

Example 9

Light-reflective conductive particles having a grey appearance, and an anisotropic conductive adhesive, were obtained in the same manner as in Example 3, except that a titanium oxide powder having an average particle size of 0.2 μm (JR405, Tayca Corporation) was used instead of the titanium oxide powder having an average particle size of 0.5 μm. Further, a light reflectance evaluation test and an electrical properties (continuity reliability, insulation reliability) evaluation test were also carried out in the same manner as in Example 1. The obtained results are shown in Table 1.

Comparative Example 1

Figure 3:
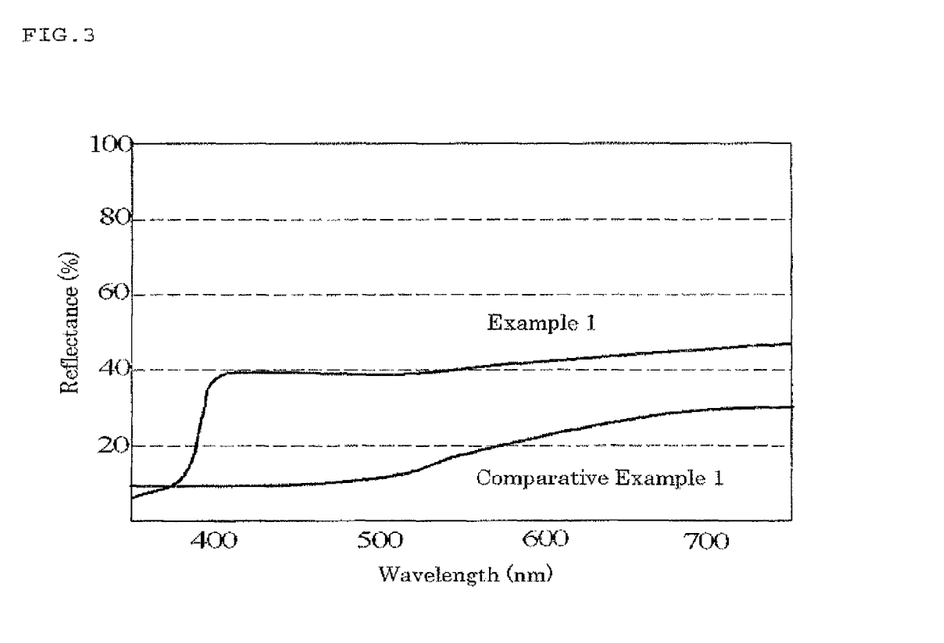
FIG. 3 is a graph illustrating the light reflectance of the cured products of the anisotropic conductive adhesives of Example 1 and Comparative Example 1 with respect to wavelength.

An anisotropic conductive adhesive was obtained in the same manner as in Example 1 using Au-coated resin conductive particles having a brown appearance (particles formed by coating a 0.2 μm-thick electroless gold plating on spherical acrylic resin particles having an average particle size of 4.6

μm (Bright 20GNB4.6 EH, Nippon Chemical Industrial Co., Ltd.). Further, a light reflectance evaluation test and an electrical properties (continuity reliability, insulation reliability) evaluation test were also carried out in the same manner as in Example 1. The obtained results are shown in Table 1. The light reflectance is also illustrated in FIG. 3.

Comparative Example 2

An anisotropic conductive adhesive was obtained in the same manner as in Comparative Example 1, except that Ni-coated resin conductive particles having a brown appearance and an average particle size of 5.0 μm (52NR-4.6 EH, Nippon Chemical Industrial Co., Ltd.) were used instead of Au-coated resin conductive particles. Further, a light reflectance evaluation test and an electrical properties (continuity reliability, insulation reliability) evaluation test were also carried out in the same manner as in Example 1. The obtained results are shown in Table 1.

Comparative Example 3

Light-reflective conductive particles having a brown appearance were obtained by adding 3 parts by mass of polystyrene particles having an average particle size of 0.2 μm (Glossdell 204S, Mitsui Chemicals, Inc.) and 20 parts by mass of conductive particles having an average particle size of 5 μm (particles formed by coating a 0.2 μm-thick electroless gold plating on spherical acrylic resin particles having an average particle size of 4.6 μm (Bright 20GNB4.6 EH, Nippon Chemical Industrial Co., Ltd.)) to a mechanofusion apparatus (AMS-GMP, Hosokawa Micron Group), and depositing a 0.2 μm-thick styrene layer on the surface of the conductive particles under conditions of a rotation speed of 1,000 rpm and a rotation time of 20 minutes. Then, an anisotropic conductive adhesive was obtained. Further, a light reflectance evaluation test and an electrical properties (continuity reliability, insulation reliability) evaluation test were also carried out in the same manner as in Example 1. The obtained results are shown in Table 1.

Comparative Example 4

Conductive particles having a brown appearance, and an anisotropic conductive adhesive, were obtained in the same manner as in Example 3, except that a silicon oxide powder having an average particle size of 0.5 μm (Seahosta KEP-30, Nippon Shokubai Co., Ltd.) was used instead of the titanium dioxide powder having an average particle size of 0.5 μm. Further, a light reflectance evaluation test and an electrical properties (continuity reliability, insulation reliability) evaluation test were also carried out in the same manner as in Example 1. The obtained results are shown in Table 1.

TABLE 1

| | | EXAMPLE | | | | | | | | | COMPARATIVE EXAMPLE | | | |
|---|---|---|---|---|---|---|---|---|---|---|---|---|---|---|
| | | 1 | 2 | 3 | 4 | 5 | 6 | 7 | 8 | 9 | 1 | 2 | 3 | 4 |
| Raw Material Conductive Particles | Surface Metal | Au | Ni | Au | Ni | Au | Au | Au | Au | Au | Au | Ni | Au | Au |
| | Particle Size (μm) | 5.0 | 5.0 | 5.0 | 5.0 | 5.0 | 5.0 | 5.0 | 5.0 | 5.0 | 5.0 | 5.0 | 5.0 | 5.0 |
| Adhesive Particles | Type | — | — | PS | PS | PE | PS | PS | PS | PS | — | — | PS | PS |
| | Particle Size (μm) | — | — | 0.2 | 0.2 | 0.1 | 0.2 | 0.2 | 0.2 | 0.2 | — | — | 0.2 | 0.2 |
| Inorganic Particles | Type | TiO$_2$ | TiO$_2$ | TiO$_2$ | TiO$_2$ | TiO$_2$ | ZnO | Al$_2$O$_3$ | MgCO$_3$ | TiO$_2$ | — | — | — | SiO$_2$ |
| | Particle Size (μm) | 0.5 | 0.5 | 0.5 | 0.5 | 0.5 | 0.5 | 0.5 | 0.5 | 0.2 | — | — | — | 0.5 |
| | Refractive Index n1 | 2.71 | 2.71 | 2.71 | 2.71 | 2.71 | 1.95 | 1.76 | 1.52 | 2.71 | — | — | — | 1.45 |
| Light-Reflective Conductive Particles | Color | Grey | Grey | Grey | Grey | Grey | Grey | Grey | Grey | Grey | Brown | Black | Brown | Brown |
| | Reflectance (%) | 30 | 32 | 30 | 32 | 30 | 22 | 17 | 15 | 30 | 8 | 9 | 8 | 9 |
| Continuity Reliability | Initial | A | A | A | A | A | A | A | A | A | A | A | A | A |
| | After TCT | A | A | A | A | A | A | A | A | A | A | A | A | A |
| Insulation Reliability | Initial | A | A | A | A | A | A | A | A | A | C | C | A | A |
| | After Aging | A | A | A | A | A | A | A | A | A | C | C | C | A |

As can be seen from Table 1, the anisotropic conductive adhesives using the light-reflective conductive particles of Examples 1 to 9 all had a light reflectance of 30% or more, and reflected blue light having a wavelength of 450 nm without change. In addition, the continuity reliability and insulation reliability results were also good.

In contrast, since Comparative Examples 1 to 3 did not have a light-reflecting layer on the surface of the conductive particles, light reflectance was about 10%. In Comparative Examples 1 and 2, short circuits occurred from the initial stage, and in Comparative Example 3, a short circuit occurred after aging, so that insulating reliability was a problem. In Comparative Example 4, since silicon oxide was used for the inorganic particles, the conductive particles had a brown color even after the inorganic particle layer was formed, and light reflectance was about 10%. The reason for this can be thought to be because the difference between the refractive index of the silicon oxide and the binder composition of the anisotropic conductive adhesive was less than 0.02.

INDUSTRIAL APPLICABILITY

The light-reflective conductive particle of the present invention can prevent a deterioration in light-emitting efficiency and the occurrence of a hue difference between the emission color of the light-emitting element and the reflected color even if a light-reflecting layer that causes production costs to increase is not provided on a light-emitting diode (LED) element, when producing a light-emitting device by flip-chip mounting a light-emitting element such as an LED element to a wiring board using an anisotropic conductive adhesive. Therefore, the anisotropic conductive adhesive of the present invention is useful when flip-chip mounting an LED element.

REFERENCE SIGNS LIST 1 core particle
2 light-reflective inorganic particle
3 light-reflecting layer
4 thermoplastic resin
10, 20 light-reflective conductive particle
11 cured product of thermosetting resin composition
21 substrate
22 connection terminal
23 LED element
24 n electrode
25 p electrode
26 bump
100 cured product of anisotropic conductive adhesive
200 light-emitting device

The invention claimed is:

1. A light-reflective conductive particle for an anisotropic conductive adhesive used for anisotropic conductive connection of a light-emitting element to a wiring board, comprising a core particle coated with a metal material and a light-reflecting layer formed from light-reflective inorganic particles having a refractive index of 1.52 or more on a surface of the core particle, wherein the light-reflecting layer contains a thermoplastic resin.

2. The light-reflective conductive particle according to claim 1, wherein the metal material with which the core particle is coated is gold, nickel, or copper.

3. The light-reflective conductive particle according to claim 1, wherein the core particle itself is a gold, nickel, or copper particle.

4. The light-reflective conductive particle according to claim 1, wherein the core particle is formed by coating gold, nickel or copper on a resin particle.

5. The light-reflective conductive particle according to claim 1, wherein the core particle has a particle size of 1 to 20 μm, and the light-reflecting layer has a layer thickness of 0.5 to 50% of the particle size of the core particle.

6. The light-reflective conductive particle according to claim 1, wherein the light-reflective inorganic particle is at least one type of inorganic particles selected from titanium oxide particles, zinc oxide particles, and aluminum oxide particles.

* * * * *